US010825943B2

(12) United States Patent
Saito et al.

(10) Patent No.: US 10,825,943 B2
(45) Date of Patent: Nov. 3, 2020

(54) CONCENTRATING SOLAR POWER GENERATION MODULE, CONCENTRATING SOLAR POWER GENERATION PANEL, AND CONCENTRATING SOLAR POWER GENERATION DEVICE

(71) Applicant: Sumitomo Electric Industries, Ltd., Osaka (JP)

(72) Inventors: Kenji Saito, Osaka (JP); Youichi Nagai, Osaka (JP); Rui Mikami, Osaka (JP); Akihiko Kojima, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 58 days.

(21) Appl. No.: 16/319,215

(22) PCT Filed: Jul. 10, 2017

(86) PCT No.: PCT/JP2017/025095
§ 371 (c)(1),
(2) Date: Jan. 18, 2019

(87) PCT Pub. No.: WO2018/025589
PCT Pub. Date: Feb. 8, 2018

(65) Prior Publication Data
US 2019/0237606 A1   Aug. 1, 2019

(30) Foreign Application Priority Data

Aug. 3, 2016  (JP) .................................. 2016-152903

(51) Int. Cl.
*H01L 31/042* (2014.01)
*H02N 6/00* (2006.01)
(Continued)

(52) U.S. Cl.
CPC ........ *H01L 31/0543* (2014.12); *H01L 31/054* (2014.12); *H02S 20/10* (2014.12);
(Continued)

(58) Field of Classification Search
CPC .................................................. H01L 31/0543
See application file for complete search history.

(56) References Cited

U.S. PATENT DOCUMENTS

2009/0133737 A1* 5/2009 Anzawa .............. H01L 31/0543
136/246
2010/0018570 A1* 1/2010 Cashion .............. H01L 31/0547
136/246
(Continued)

FOREIGN PATENT DOCUMENTS

JP   2000-091612 A     3/2000
JP   2006-344698 A    12/2006
(Continued)

OTHER PUBLICATIONS

English machine translation of JP 2014-038881 A (Year: 2020).*
Sina Ebnesajjad, "Surface Treatment of Materials for Adhesive Bonding," Elsevier, 2nd ed., 2014, p. 5. (Year: 2014).*

*Primary Examiner* — Angelo Trivisonno
(74) *Attorney, Agent, or Firm* — Baker Botts L.L.P.; Michael A. Sartori

(57) ABSTRACT

A concentrator photovoltaic module including: a concentrating portion formed by arranging a plurality of lens elements each configured to concentrate sunlight; and a housing configured to accommodate a plurality of power generating elements disposed at positions respectively corresponding to the lens elements, wherein the housing includes: a frame body formed from resin; and a bottom plate formed from metal, the bottom plate being mounted to the frame body and having the power generating elements mounted thereto, and the frame body includes: a frame body (Continued)

portion forming an outer frame; and a liner portion extending along an upper surface of the bottom plate at an inner side of the frame body portion, the liner portion having both end portions thereof formed integrally with the frame body portion.

8 Claims, 11 Drawing Sheets

(51) Int. Cl.
      *H01L 31/054* (2014.01)
      *H02S 30/10* (2014.01)
      *H02S 20/32* (2014.01)
      *H02S 20/10* (2014.01)

(52) U.S. Cl.
     CPC .............. *H02S 20/32* (2014.12); *H02S 30/10* (2014.12); *Y02E 10/52* (2013.01)

(56) References Cited

U.S. PATENT DOCUMENTS

| | | | |
|---|---|---|---|
| 2012/0298181 A1 | 11/2012 | Cashion et al. | |
| 2013/0199595 A1 | 8/2013 | Martin et al. | |
| 2014/0230883 A1* | 8/2014 | Iwasaki | H05K 1/189 |
| | | | 136/246 |
| 2014/0251413 A1 | 9/2014 | Parras Padilla et al. | |

FOREIGN PATENT DOCUMENTS

| | | |
|---|---|---|
| JP | 2013-131647 A | 7/2013 |
| JP | 2013-207079 A | 10/2013 |
| JP | 2014-038881 A | 2/2014 |
| JP | 2014038881 A * | 2/2014 |
| WO | 2013/098426 A1 | 7/2013 |
| WO | 2013/115938 A1 | 8/2013 |

\* cited by examiner

CONCENTRATING SOLAR POWER GENERATION MODULE, CONCENTRATING SOLAR POWER GENERATION PANEL, AND CONCENTRATING SOLAR POWER GENERATION DEVICE

TECHNICAL FIELD

The present invention relates to a concentrator photovoltaic module, a concentrator photovoltaic panel, and a concentrator photovoltaic apparatus.

This application claims priority based on Japanese Patent Application No. 2016-152903 filed on Aug. 3, 2016, the entire contents of which are incorporated herein by reference.

BACKGROUND ART

Concentrating-type photovoltaic power generation employs a basic configuration in which sunlight concentrated through lenses is applied to power generating elements which are composed of small compound semiconductor elements and the like each having a high power generation efficiency (for example, see PATENT LITERATURE 1). A concentrator photovoltaic module is obtained by arranging a large number of such basic units in a matrix shape in one housing. A concentrator photovoltaic panel is obtained by further arranging a plurality of the modules. This concentrator photovoltaic panel, together with a driving device which causes the panel to perform tracking operation while facing the sun, forms a concentrator photovoltaic apparatus.

In the concentrator photovoltaic module mentioned above, the bottom plate of the housing has a large number of power generating elements mounted at the surface thereof. As a material of this bottom plate, a plate member formed from metal (for example, aluminium or the like) and having a small plate thickness is considered to be preferable from the viewpoint of suppressing production cost and ensuring heat dissipation performance. The frame body forming the outer frame of the housing supports an outer edge portion of the bottom plate. As a material of this frame body, a plate member formed from resin is considered to be preferable in order to suppress production cost.

CITATION LIST

Patent Literature

PATENT LITERATURE 1: International Publication WO2013/115938
PATENT LITERATURE 2: International Publication WO2013/098426

SUMMARY OF INVENTION

Technical Problem

A concentrator photovoltaic module of the present disclosure is a concentrator photovoltaic module including: a concentrating portion formed by arranging a plurality of lens elements each configured to concentrate sunlight; and a housing configured to accommodate a plurality of power generating elements disposed at positions respectively corresponding to the lens elements. The housing includes: a frame body formed from resin; and a bottom plate formed from metal, the bottom plate being mounted to the frame body and having the power generating elements mounted thereto. The frame body includes: a frame body portion forming an outer frame; and a liner portion extending along an upper surface of the bottom plate at an inner side of the frame body portion, the liner portion having both end portions thereof formed integrally with the frame body portion.

A concentrator photovoltaic panel of the present disclosure is a concentrator photovoltaic panel formed by arranging a plurality of the concentrator photovoltaic modules described above.

A concentrator photovoltaic apparatus of the present disclosure is a concentrator photovoltaic apparatus including: the concentrator photovoltaic panel described above; and a driving device configured to drive the concentrator photovoltaic panel so as to perform operation of tracking movement of the sun while facing a direction of the sun.

DESCRIPTION OF EMBODIMENTS

Figure 1:
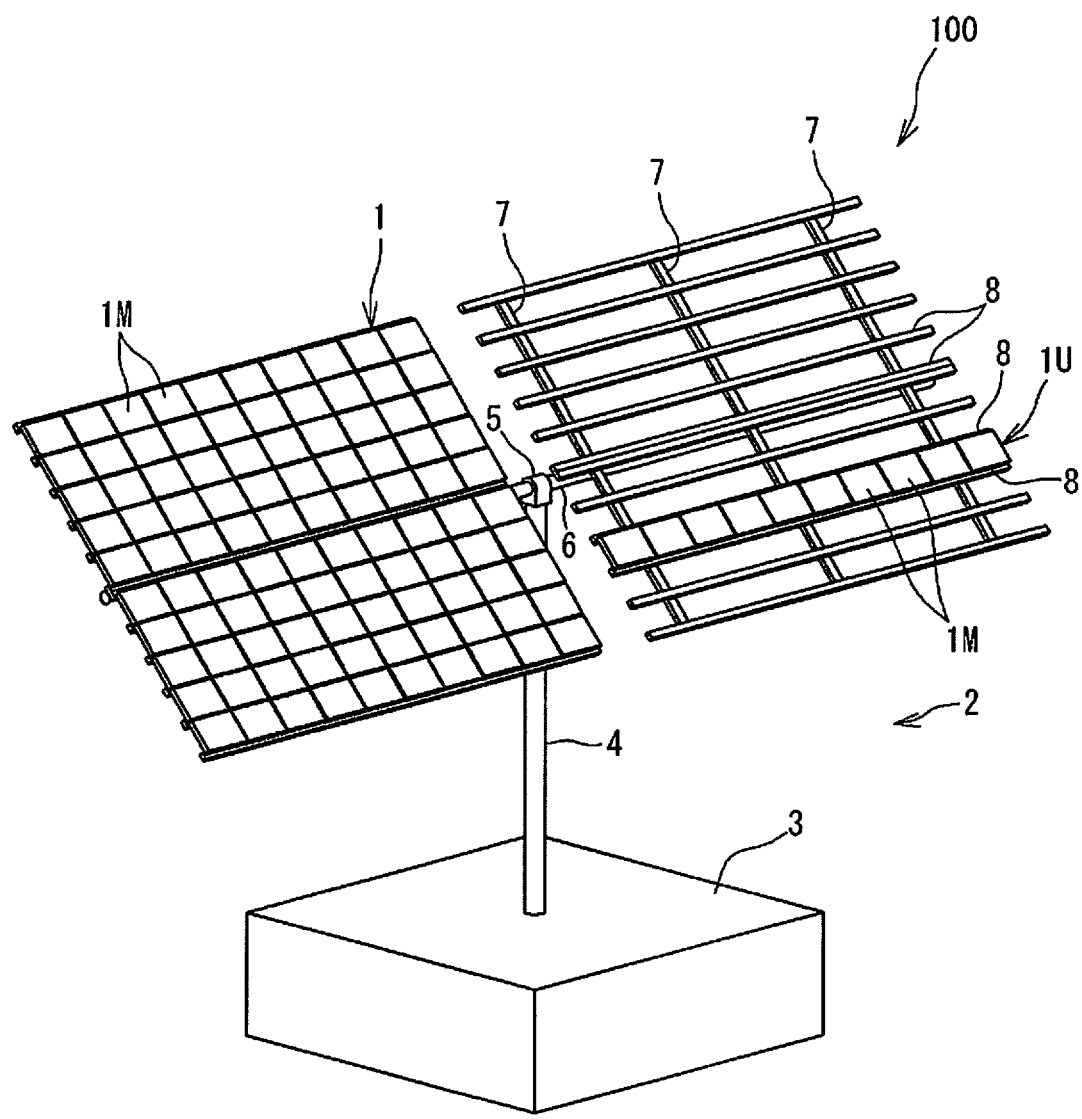
FIG. 1 is a perspective view showing one example of a concentrator photovoltaic apparatus.

Problems to be Solved by the Present Disclosure

In the conventional concentrator photovoltaic module described above, when the temperatures of the power generating elements mounted at the bottom plate of the housing increase, the metal bottom plate easily undergoes thermal expansion. Thus, in a case where expansion in the surface direction of the bottom plate due to thermal expansion is restricted, the bottom plate deforms so as to bulge into a protruding shape in a direction perpendicular to the surface, whereby the positions of the power generating elements are shifted from the positions at which the power generating elements should be located. This causes a problem of decreased power generation efficiency. Meanwhile, a resin frame body has a smaller withstand load strength than a metal frame body. Thus, if the number of power generating elements mounted at the bottom plate is increased, there is also a problem that the resin frame body cannot withstand the weight of these power generating elements and is broken.

Therefore, an object of the present invention is to inhibit positional displacement of power generating elements due to thermal expansion of a metal bottom plate, and to improve the withstand load strength of a resin frame body.

Effects of the Present Disclosure

According to the present disclosure, positional displacement of power generating elements due to thermal expansion of a metal bottom plate can be inhibited, and the withstand load strength of a resin frame body can be improved.

DESCRIPTION OF EMBODIMENTS OF THE PRESENT DISCLOSURE

First, contents of an embodiment of the present disclosure are listed and described.

(1) A concentrator photovoltaic module according to an embodiment of the present disclosure is a concentrator photovoltaic module including: a concentrating portion formed by arranging a plurality of lens elements each configured to concentrate sunlight; and a housing configured to accommodate a plurality of power generating elements disposed at positions respectively corresponding to the lens elements. The housing includes: a frame body formed from resin; and a bottom plate formed from metal, the bottom plate being mounted to the frame body and having the power generating elements mounted thereto. The frame body includes: a frame body portion forming an outer frame; and a liner portion extending along an upper surface of the bottom plate at an inner side of the frame body portion, the liner portion having both end portions thereof formed integrally with the frame body portion.

According to the concentrator photovoltaic module described above, the frame body of the housing has the liner portion extending along the upper surface of the bottom plate at the inner side of the frame body portion. Thus, deformation of the bottom plate due to thermal expansion into a protruding shape can be inhibited by the liner portion. In addition, since both end portions of the liner portion are formed integrally with the frame body portion at the inner side thereof, the withstand load strength of the entirety of the frame body can be improved by this liner portion.

(2) In the concentrator photovoltaic module, preferably, the frame body is formed from a resin material that contains glass fibers, and the liner portion has a shape changing portion in a halfway portion in a longitudinal direction thereof.

In this case, if the glass fibers are caused to take random fiber orientations by the shape changing portion during resin-molding of the liner portion, the coefficient of linear expansion of the liner portion can be changed, and as a result, the thermal expansion amount at the operation temperature of the liner portion can be adjusted. Therefore, even in a case where the operation temperatures of the liner portion and the bottom plate are different from each other, if the thermal expansion amount of the liner portion and the thermal expansion amount of the bottom plate are adjusted so as to match each other, the difference between the thermal expansion amount of the liner portion and the thermal expansion amount of the bottom plate can be reduced.

(3) In the concentrator photovoltaic module, preferably, the housing further includes a shielding member which covers the liner portion.

In this case, when the light concentrated position by a lens element of the concentrating portion has shifted, the concentrated sunlight can be prevented from hitting the liner portion by the shielding member. Thus, the liner portion can be prevented from being damaged by heat due to sunlight.

(4) In the concentrator photovoltaic module, preferably, the shielding member is made of metal.

In this case, the shielding member has good reflectance of sunlight and small absorptivity of sunlight, and thus, thermal damage of the liner portion due to sunlight can be assuredly prevented.

(5) In the concentrator photovoltaic module, preferably, the liner portion has a positioning portion configured to position the bottom plate with respect to the liner portion.

In this case, the bottom plate can be easily positioned with respect to the liner portion.

(6) In the concentrator photovoltaic module, preferably, the housing includes a screw penetrating the bottom plate and configured to fix the bottom plate to the liner portion, and a seal layer configured to seal an inside of the housing around the screw penetrating the bottom plate is formed between the bottom plate and the liner portion.

In this case, entry of foreign substances such as water and dust into the inside of the housing through the gap present between the bottom plate and the screw penetrating the bottom plate can be inhibited.

(7) In the concentrator photovoltaic module, preferably, an adhesion surface, of the liner portion, to which the seal layer is adhered, is embossed.

In this case, the seal layer can be firmly adhered to the liner portion, and thus, entry of foreign substances such as water and dust into the inside of the housing can be further inhibited.

(8) A concentrator photovoltaic panel according to an embodiment of the present disclosure is formed by arranging a plurality of the concentrator photovoltaic modules according to (1) above.

Such a concentrator photovoltaic panel can obtain desired power generation.

(9) A concentrator photovoltaic apparatus according to an embodiment of the present disclosure includes: the concentrator photovoltaic panel according to (8) above; and a driving device configured to drive the concentrator photovoltaic panel so as to perform operation of tracking movement of the sun while facing a direction of the sun.

In this case, it is possible to provide a concentrator photovoltaic apparatus that always maintains, during daytime, the state where the power generation efficiency is highest at that point in time.

DETAILS OF EMBODIMENTS OF THE PRESENT DISCLOSURE

Hereinafter, an embodiment of the present disclosure is described in detail with reference to the attached drawings. It should be noted that at least parts of the embodiment described below may be combined as desired.

<Concentrator Photovoltaic Apparatus and Concentrator Photovoltaic Panel>

First, a configuration of a concentrator photovoltaic apparatus is described. FIG. 1 is a perspective view showing one example of the concentrator photovoltaic apparatus. In FIG. 1, a concentrator photovoltaic apparatus 100 includes: a concentrator photovoltaic panel 1 composed of two panels, i.e., left wing and right wing; and a pedestal 2 which supports the concentrator photovoltaic panel (hereinafter, also simply referred to as a "photovoltaic panel") 1 at the rear face side thereof. In FIG. 1, with respect to the panel 1 at the right side on the drawing sheet, a part of the photovoltaic panel 1 is omitted in order to show the structure of the pedestal 2.

The pedestal 2 includes: a base 3; and a support portion 4 standing on the base 3. The base 3 is fixed to the ground. The support portion 4 is vertically provided. A driving device 5, which drives the photovoltaic panel 1 so as to perform operation of tracking the movement of the sun while facing the direction of the sun, is provided at the support point of the photovoltaic panel 1. The support point is at the upper end of the support portion 4. Specifically, the driving device 5 drives the photovoltaic panel 1 so as to rotate in the elevation direction about a horizontally extending shaft 6. In addition, the driving device 5 drives the photovoltaic panel 1 so as to rotate in the azimuth direction about the support portion 4.

The driving device 5 is controlled by a control device (not shown). The control device has a drive circuit for driving built-in motors of the driving device 5. Through the operation of the motor (stepping motor) for each axis, the photovoltaic panel 1 can take an attitude at any angle for each of the azimuth and the elevation.

The shaft 6 driven by the driving device 5 is provided with a plurality of beams 7 in a direction perpendicular to the shaft 6. The photovoltaic panel 1 is fixed to the upper side of the plurality of beams 7. The photovoltaic panel 1 is formed by arraying, in multiple rows, units 1U each formed by arranging 10 concentrator photovoltaic modules 1M horizontally in a row, for example.

Each unit 1U includes: a plurality of concentrator photovoltaic modules 1M; and a pair of frames 8 which integrally fix these concentrator photovoltaic modules 1M in a state of being aligned in a line. Each unit 1U is extended over the beams 7 and is fixed to the upper side of the beams 7.

Each wing of the photovoltaic panel 1 is composed of 10 units 1U, for example. Accordingly, each wing of the photovoltaic panel 1 is formed by arranging 10 (in length)× 10 (breadth) photovoltaic modules 1M in a matrix shape. Accordingly, 200 concentrator photovoltaic modules 1M are present in the photovoltaic panel 1 having the two wings.

<Concentrator Photovoltaic Module>

Figure 2:
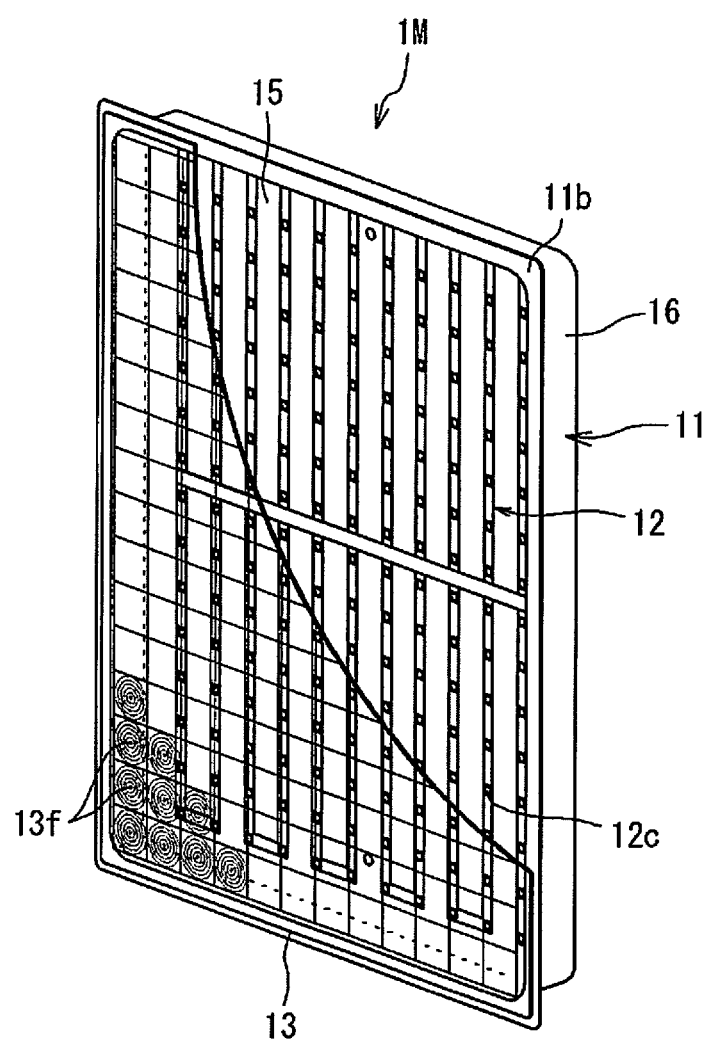
FIG. 2 is an enlarged perspective view showing a concentrator photovoltaic module according to one embodiment of the present invention.

FIG. 2 is an enlarged perspective view (with a part of a concentrating portion 13 cut out) showing a concentrator photovoltaic module (hereinafter, also simply referred to as a module) 1M according to one embodiment of the present disclosure. In FIG. 2, the module 1M includes, as major components: a housing 11 in a box shape; a flexible printed circuit 12 arranged in a plurality of rows at a bottom plate 15 of the housing 11; and a concentrating portion 13 mounted, like a cover, at a flange portion 11b of the housing 11.

The flexible printed circuit 12 is obtained by providing a strip-film-shaped insulating base material with an electric conductor layer forming a circuit pattern. On top of this, power generating elements (solar cells) 12c and other electronic components are mounted. As each power generating element 12c, a solar battery having heat resistance and high power generation efficiency is used.

The housing 11 includes: the bottom plate 15 where the flexible printed circuit 12 is disposed; and a frame body 16 to which an outer edge portion and the like of the bottom plate 15 are mounted and which holds the concentrating portion 13 so as to face the bottom plate 15. The housing 11 will be described later in detail.

The concentrating portion 13 is a Fresnel lens array and is formed by arranging, in a matrix shape, a plurality (for example, 16 in length×12 in breadth, 192 in total) of Fresnel lenses 13f as lens elements, each of which concentrates sunlight. The concentrating portion 13 can be obtained by, for example, forming a silicone resin film at the back surface of a glass plate as a base material. Each Fresnel lens 13f is formed at this resin film. The total number and arrangement of the Fresnel lenses 13f are the same as the total number and arrangement of the power generating elements 12c, and the Fresnel lenses 13f and the power generating elements 12c are in one-to-one correspondence so that their optical axes are aligned with each other.

Figure 3:
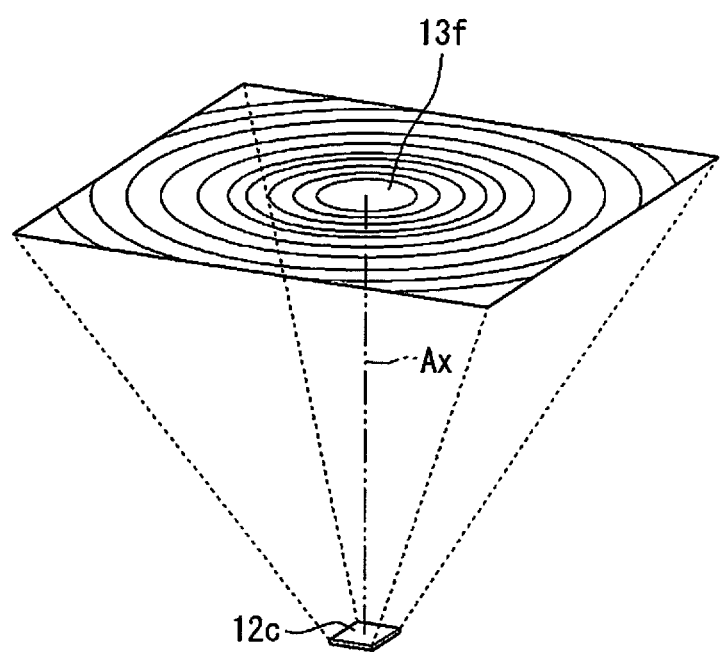
FIG. 3 is a perspective view showing the optical relationship between a Fresnel lens and a power generating element.

FIG. 3 is a perspective view showing the optical relationship between one Fresnel lens 13f and one power generating element 12c. The optical axis Ax of the Fresnel lens 13f passes through the center of the power generating element 12c. When sunlight is incident on the Fresnel lens 13f at an incidence angle of 0 degrees, light having been converged by the Fresnel lens 13f is concentrated at the power generating element 12c and the power generating element 12c generates power. During daytime, if the photovoltaic panel 1 (FIG. 1) accurately tracks the sun, such optical relationship is always established, whereby power generation is efficiently performed.

<Housing>

Figure 4:
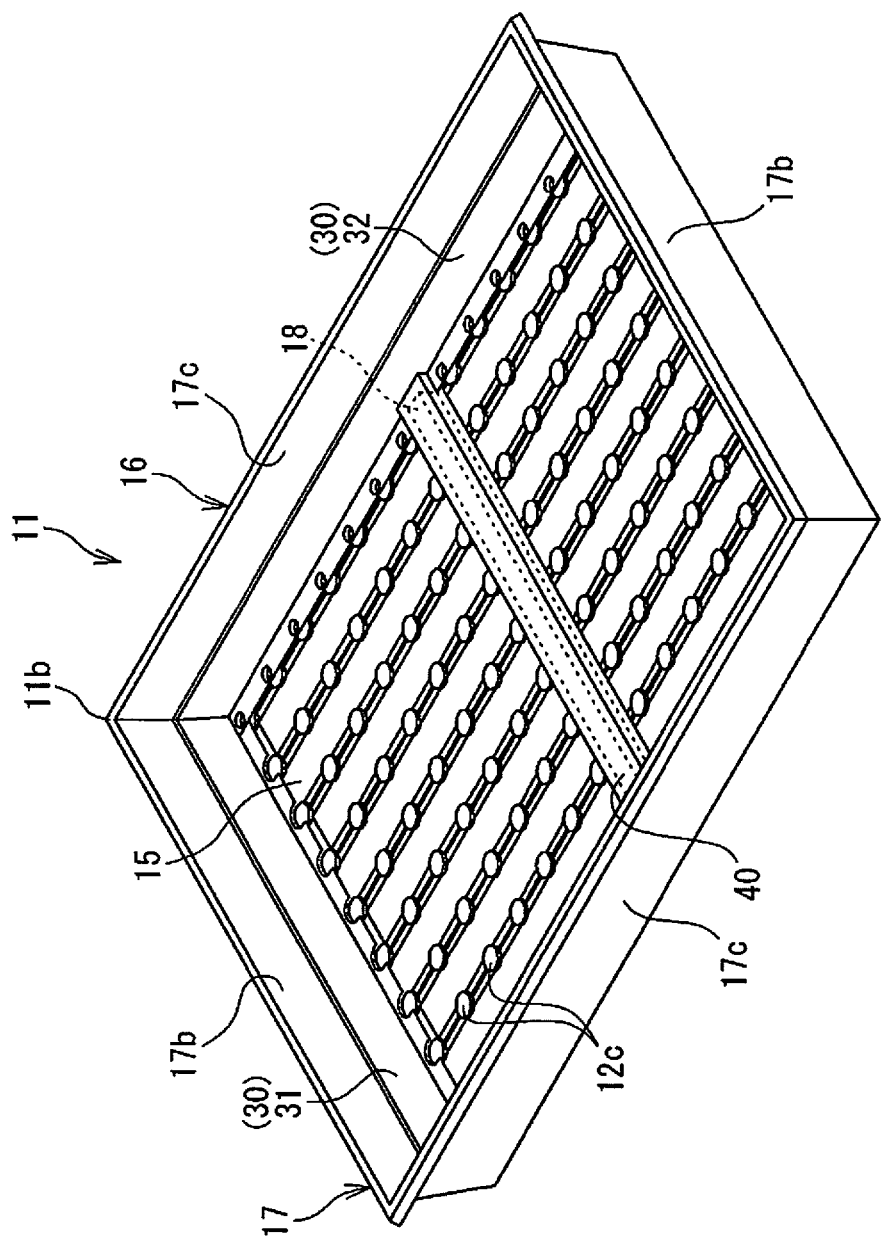
FIG. 4 is a perspective view showing a housing.
Figure 5:
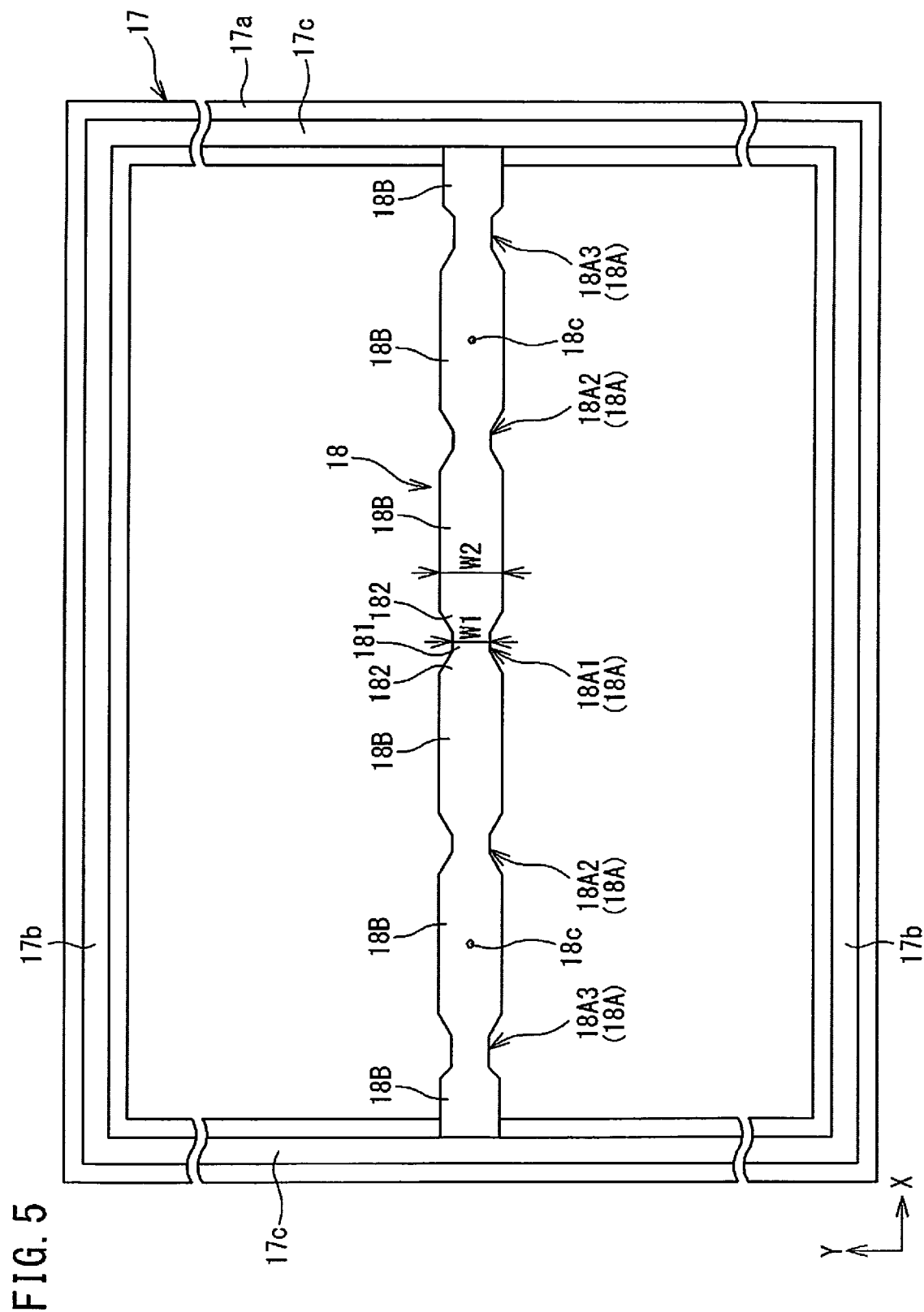
FIG. 5 is a plan view showing a frame body of the housing.

FIG. 4 is a perspective view showing the housing 11. FIG. 5 is a plan view showing the frame body 16 of the housing 11. In FIG. 4 and FIG. 5, the housing 11 is formed in a quadrate (here, rectangular (or alternatively, square)) box shape. The housing 11 is configured by mounting the bottom plate 15 formed from metal such as aluminium to the frame body 16 formed from resin, for example.

The frame body 16 is formed from a resin material such as PBT (Poly Butylene Terephtalate) resin loaded with glass fibers, for example. The frame body 16 includes: a frame body portion 17 forming the outer frame (side wall frame); and a liner portion 18 formed integrally with the frame body portion 17 at the inner side of the frame body portion 17.

The frame body portion 17 is obtained by integrally forming: a base portion 17a in a quadrate frame shape; and a pair of short-side lateral wall portions 17b protruding from the base portion 17a and a pair of long-side lateral wall portions 17c protruding from the base portion 17a. An outer edge portion of the bottom plate 15 is fixed to the back surface of the base portion 17a by a fastening member (not shown). The flange portion 11b to which the concentrating portion 13 (see FIG. 2) is mounted as described above is formed at the upper end of each of the short-side lateral wall portions 17b and the long-side lateral wall portions 17c.

<Liner Portion>

The liner portion 18 is composed of a plate-shaped member, for example, and is formed so as to extend in the short-side direction along a center portion in the long-side direction at the upper surface of the bottom plate 15. The liner portion 18 is disposed so as to extend between the power generating elements 12c at the upper surface of the bottom plate 15. Both end portions in the longitudinal direction of the liner portion 18 are coupled to center portions in the longitudinal direction at the inner surfaces of the long-side lateral wall portions 17c. Accordingly, the center portion in the longitudinal direction of each long-side lateral wall portion 17c can be prevented from deforming so as to warp to the inner side or the outer side.

Narrowed portions 18A are formed at a plurality of places (five places in the example shown) in a halfway portion in the longitudinal direction of the liner portion 18. Each narrowed portion 18A includes: a straight portion 181 having a width dimension W1 smaller than a width dimension W2 of an un-narrowed portion 18B in which the narrowed portion 18A is not formed; and tapered portions 182 formed at both end portions of the straight portion 181. Each tapered portion 182 is formed so as to have a gradually increasing width dimension in accordance with increase of the distance from the straight portion 181.

Figure 6:
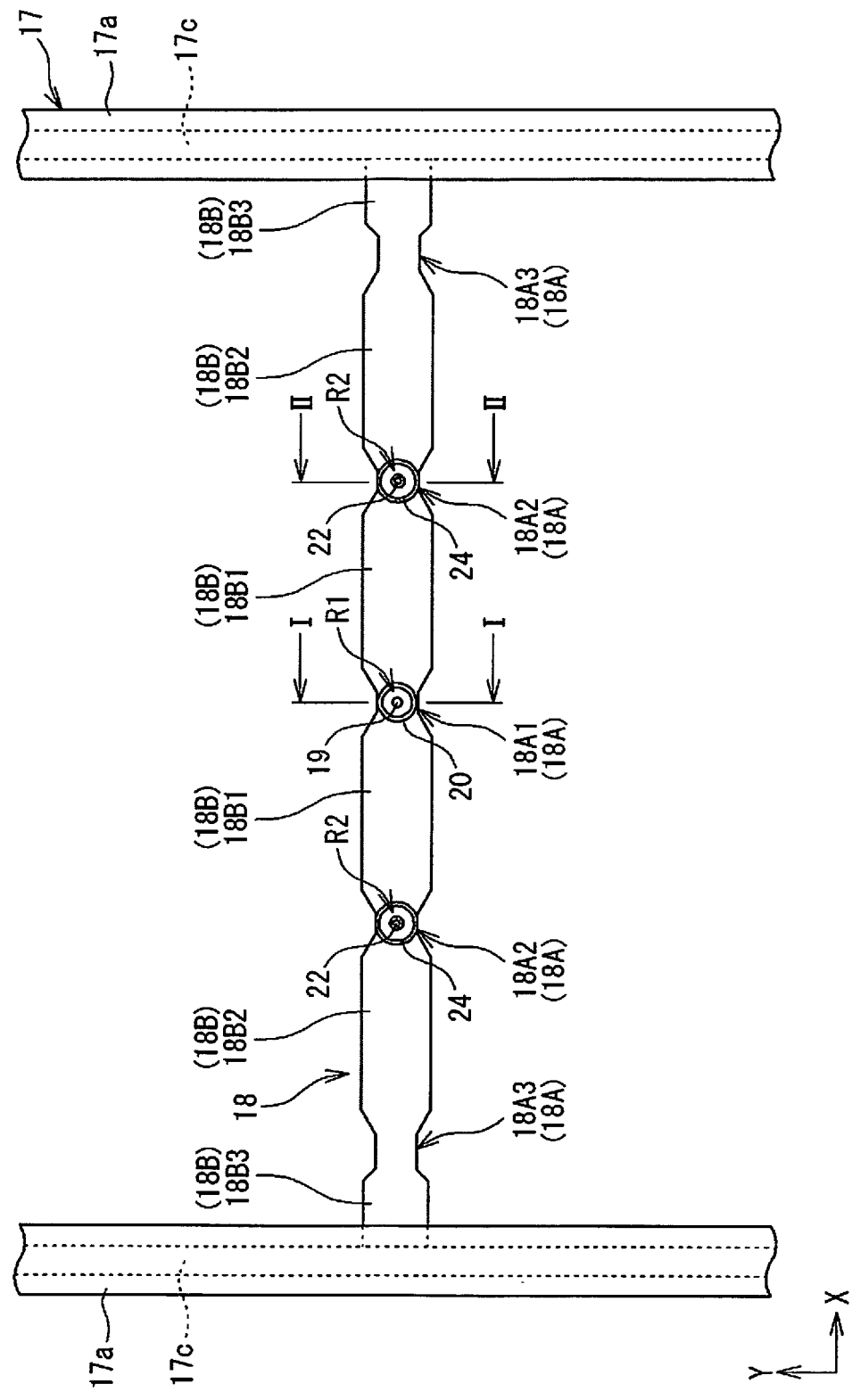
FIG. 6 is a bottom view of a liner portion.
Figure 7:
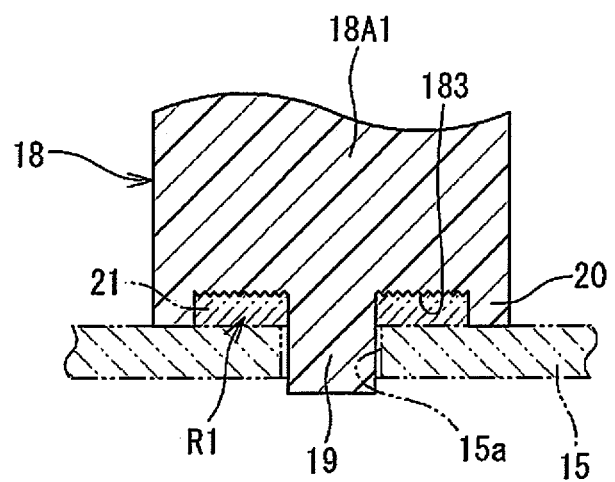
FIG. 7 is a cross-sectional view taken along arrows I-I shown in FIG. 6.

FIG. 6 is a bottom view of the liner portion 18. FIG. 7 is a cross-sectional view taken along arrows I-I shown in FIG. 6. In FIG. 6 and FIG. 7, a positioning pin (positioning portion) 19 for positioning the bottom plate 15 with respect to the liner portion 18 is formed in a narrowed portion 18A1 formed in a center portion in the longitudinal direction of the liner portion 18. The positioning pin 19 is formed in a columnar shape, for example, and is formed integrally with the narrowed portion 18A1 so as to protrude from a center portion of a bottom surface of the narrowed portion 18A1.

The positioning pin 19 is inserted into a positioning hole 15a which penetrates in the plate thickness direction of the bottom plate 15. Accordingly, the bottom plate 15 can be easily positioned with respect to the liner portion 18.

Although the positioning pin is formed in the liner portion 18, and the positioning hole is formed in the bottom plate 15 in the present embodiment, the positioning hole may be formed in the liner portion 18 and the positioning pin may be formed in the bottom plate 15. In this case, the positioning hole functions as the positioning portion of the liner portion 18.

An annular protruding portion 20 is formed at the outer peripheral side of the positioning pin 19, integrally with the bottom surface of the narrowed portion 18A1. The protruding portion 20 is formed concentrically with the positioning pin 19. In a state where the positioning pin 19 is inserted in the positioning hole 15a of the bottom plate 15, an end surface (lower surface) of the protruding portion 20 is in contact with the upper surface of the bottom plate 15.

At the inner peripheral side of the protruding portion 20, an annular region R1 in which a sealing agent is applied so as to surround the positioning pin 19 is formed. The bottom surface of the narrowed portion 18A1 in the region R1 serves as an adhesion surface 183 to which the sealing agent adheres, and the adhesion surface 183 is embossed.

In the region R1, a seal layer 21 is formed as a result of the sealing agent being applied. The seal layer 21 bonds and fixes the surrounding portion of the positioning pin 19 in the liner portion 18 and the bottom plate 15, and closes the space between the surrounding portion of the positioning pin 19 and the bottom plate 15, thereby sealing the inside of the housing 11 from outside. Accordingly, entry of water and dust into the inside of the housing 11 through the positioning hole 15a of the bottom plate 15 can be inhibited.

Figure 8:
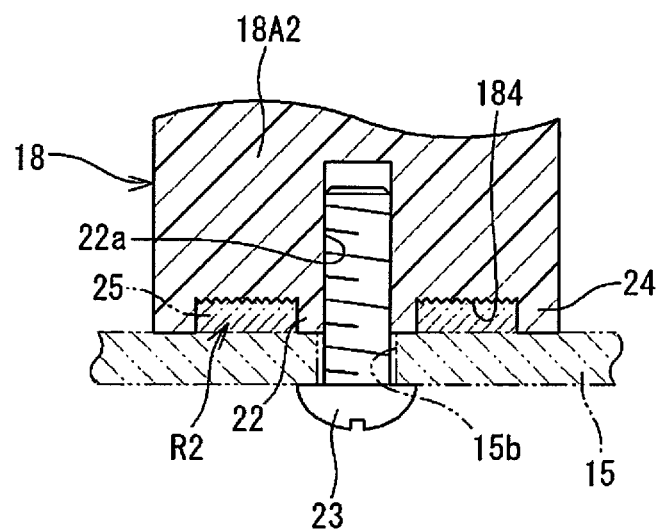
FIG. 8 is a cross-sectional view taken along arrows II-II shown in FIG. 6.

FIG. 8 is a cross-sectional view taken along arrows II-II shown in FIG. 6. With reference to FIG. 6 and FIG. 8, in the liner portion 18, at a center portion of the bottom surface of each of narrowed portions 18A2 located at both sides of the narrowed portion 18A1, an inner protruding portion 22 is formed integrally with the narrowed portions 18A2. Each inner protruding portion 22 is formed in a cylindrical shape, for example, and has a screw hole 22a formed at the inner periphery thereof. The screw hole 22a of the present embodiment is formed deep into the narrowed portion 18A2. A small male screw (screw) 23 inserted into an insertion hole 15b penetrating in the plate thickness direction of the bottom plate 15 is screwed into the screw hole 22a. Accordingly, the bottom plate 15 can be fixed to the liner portion 18. In the present embodiment, a small male screw is used as the screw 23, but a bolt may be used.

An annular outer protruding portion 24 is formed at the outer peripheral side of the inner protruding portion 22, integrally with the bottom surface of the narrowed portion 18A2. The outer protruding portion 24 is formed concentrically with and having the same height as the inner protruding portion 22. In a state where the small male screw 23 is screwed into the screw hole 22a of the inner protruding portion 22, an end surface (lower surface) of each of the inner protruding portion 22 and the outer protruding portion 24 is in contact with the upper surface of the bottom plate 15.

At the inner peripheral side of the outer protruding portion 24, an annular region R2 in which a sealing agent is applied so as to surround the inner protruding portion 22 is formed. The bottom surface of the narrowed portion 18A2 in the region R2 serves as an adhesion surface 184 to which the sealing agent adheres, and the adhesion surface 184 is embossed. Accordingly, a seal layer 25 can be firmly adhered to the liner portion 18.

In the region R2, the seal layer 25 is formed as a result of the sealing agent being applied. The seal layer 25 bonds and fixes the surrounding portion of the inner protruding portion 22 in the liner portion 18 and the bottom plate 15, and closes the space between the surrounding portion of the inner protruding portion 22 and the bottom plate 15, thereby sealing the inside of the housing 11 from outside. Accordingly, entry of foreign substances such as water and dust into the inside of the housing 11 through the insertion hole 15b of the bottom plate 15 can be inhibited.

As described above, according to the concentrator photovoltaic module 1M of the present embodiment, the frame body 16 of the housing 11 has the liner portion 18 which extends along the upper surface of the bottom plate 15 at the inner side of the frame body portion 17, and thus, the bottom plate 15 can be inhibited, by the liner portion 18, from deforming into a protruding shape due to thermal expansion. In addition, since both end portions of the liner portion 18 are integrally formed with the frame body portion 17 at the inner side thereof, the withstand load strength of the entirety of the frame body 16 can be improved by the liner portion 18.

<Fiber Orientation of Glass Fibers During Resin-Molding of Liner Portion>

In FIG. 6, the positioning pin 19 of the liner portion 18 serves as a resin injection portion (gate) into a die when the liner portion 18 is resin-molded. As indicated by the directions according to the coordinate system in FIG. 6, if the short-side direction of the frame body portion 17 is defined as the X direction, and the long-side direction of the frame body portion 17 is defined as the Y direction, the resin material injected into the die from this resin injection portion flows from the center of the positioning pin 19 toward both sides in the X direction. Then, the resin material having flowed to both sides in the X direction mixes with a resin material with which the long-side lateral wall portions 17c is resin-molded, at the junction portions between the liner portion 18 and the frame body portion 17. Thus, the glass fibers contained in the resin material of the liner portion 18 have fiber orientations as described below.

First, when the resin material is injected into the die from the resin injection portion (the positioning pin 19), glass fibers have fiber orientations concentric with the positioning pin 19 in the narrowed portion 18A1. Then, when the resin material has flowed into un-narrowed portions 18B1 adjacent at the outer side to the narrowed portion 18A1, the fiber orientations of the glass fibers are aligned with the X direction.

Then, when the resin material has flowed into the narrowed portions 18A2 adjacent at the outer side to the un-narrowed portions 18B1, the fiber orientations of the glass fibers are disturbed, and when the resin material has flowed into un-narrowed portions 18B2 adjacent at the outer side to the narrowed portions 18A2, the glass fibers take random fiber orientations.

Then, when the resin material has flowed into narrowed portions 18A3 adjacent to the un-narrowed portions 18B2, the fiber orientations of the glass fibers are disturbed again.

Then, when the resin material has flowed into un-narrowed portions 18B3 adjacent at the outer side to the narrowed portions 18A3, the resin material collides with the resin material that has flowed from the long-side lateral wall portions 17c into the un-narrowed portions 18B3, whereby the fiber orientations of the glass fibers enter a further disturbed state, and the glass fibers take further random fiber orientations.

As described above, the narrowed portions 18A2, 18A3 of the liner portion 18 of the present embodiment function as a shape changing portion for making the fiber orientations of the glass fibers random during resin-molding of the liner portion 18. The shape changing portion is not limited to the narrowed portions of the present embodiment, and may be any configuration, such as a rib or a hole, that can change the shape of the liner portion 18.

Since the glass fibers are caused to take random fiber orientations by such a shape changing portion, the coefficient of linear expansion of the liner portion 18 can be changed, and as a result, the thermal expansion amount at the operation temperature of the liner portion 18 can be adjusted. Accordingly, even when the operation temperatures of the liner portion 18 and the bottom plate 15 are different from each other, if the thermal expansion amount of the liner portion 18 and the thermal expansion amount of the bottom plate 15 are adjusted to match each other, the difference between the thermal expansion amount of the liner portion 18 and the thermal expansion amount of the bottom plate 15 can be reduced.

For example, in the present embodiment, the operation temperature of the bottom plate 15 formed from aluminium is 80 to 100° C., and the operation temperature of the liner portion 18 formed from resin is 50 to 60° C. Thus, the operation temperatures of both are different from each other.

The coefficient of linear expansion of the bottom plate 15 formed from aluminium is $23 \times 10^{-6}$(1/K). In contrast, in the case of the liner portion 18 formed from resin, the coefficient of linear expansion in the direction (X direction in FIG. 6) parallel to the flowing direction of the resin material during resin-molding of the liner portion 18 is $21 \times 10^{-6}$(1/K), and the coefficient of linear expansion in the direction (Y direction in FIG. 6) perpendicular to the flowing direction is $85 \times 10^{-6}$(1/K). Thus, coefficients of linear expansion of the liner portion 18 are different from the coefficient of linear expansion of the bottom plate 15.

Since the bottom plate 15 and the liner portion 18 have different operation temperatures and different coefficients of linear expansion from each other, the difference between the thermal expansion amount of the bottom plate 15 and the thermal expansion amount of the liner portion 18 is large. Thus, in order to reduce the difference between the thermal expansion amounts, the fiber orientations of the glass fibers during resin-molding of the liner portion 18 are made random on the basis of the thermal expansion amount at the operation temperature of the bottom plate 15, whereby the coefficient of linear expansion at the operation temperature of the liner portion 18 is changed.

Figure 9:
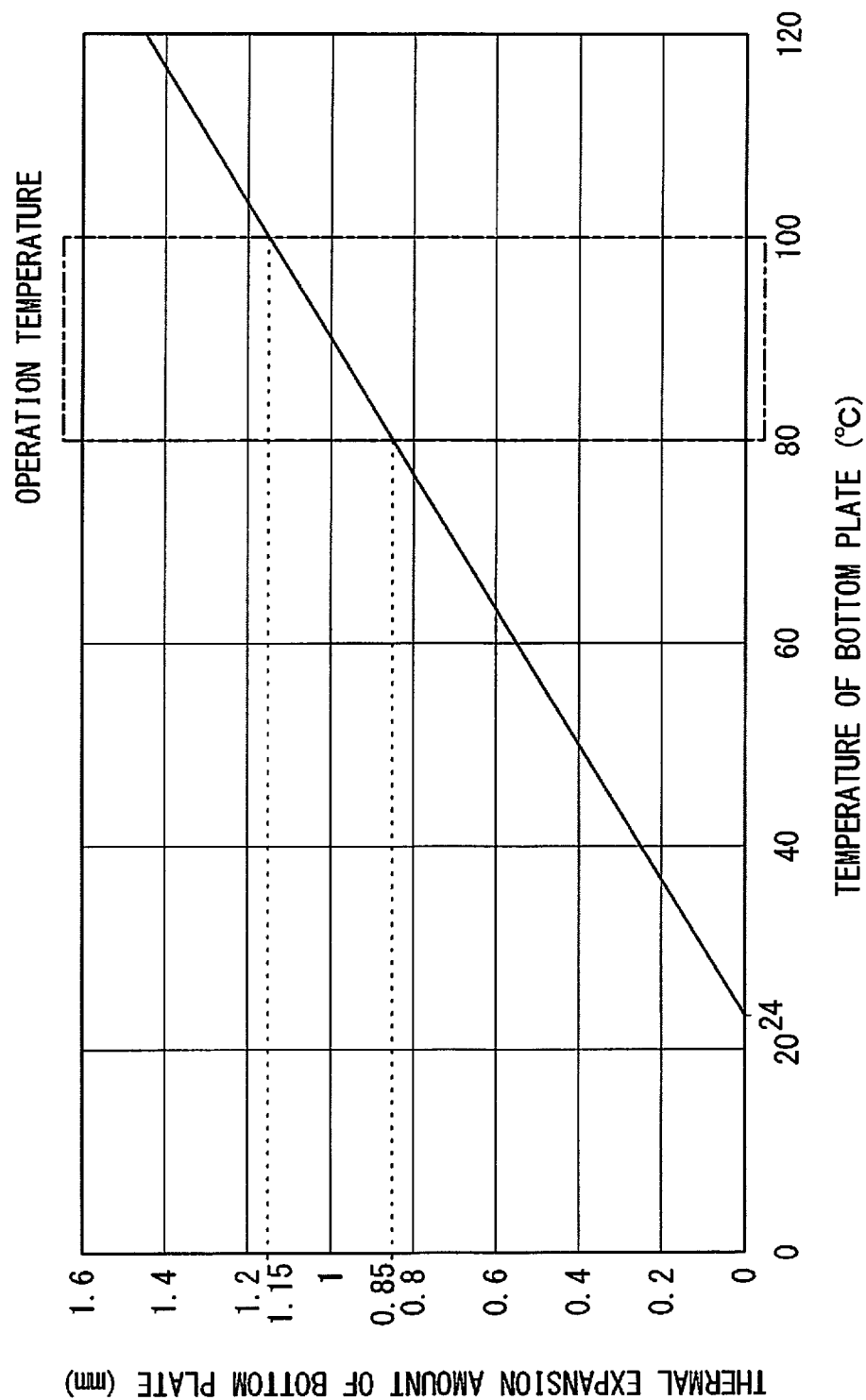
FIG. 9 is a graph showing the relationship between the temperature of the bottom plate and the thermal expansion amount thereof.

Specifically, in a case where the length dimension in the short-side direction of the bottom plate 15 formed from aluminium is 660 mm, the relationship between the temperature of the bottom plate 15 and the thermal expansion amount thereof is indicated by the graph shown in FIG. 9. The thermal expansion amount of the bottom plate 15 can be calculated from the product of: the length dimension in the short-side direction; the coefficient of linear expansion; and the increased temperature from the temperature (24° C. in the example shown in FIG. 9) before the thermal expansion.

As shown in FIG. 9, the thermal expansion amount of the bottom plate 15 at 80 to 100° C. which is the operation temperature of the bottom plate 15 is 0.85 to 1.15 mm. Thus, an orientation proportion of the glass fibers during resin-molding of the liner portion 18 is adjusted to change the coefficient of linear expansion of the liner portion 18 such that the thermal expansion amount of the liner portion 18 becomes 0.85 to 1.15 mm, which is the thermal expansion amount of the bottom plate 15. Here, the orientation proportion of the glass fibers means the proportion by which the fiber orientations of the glass fibers are in the direction parallel to the flowing direction.

Figure 10:
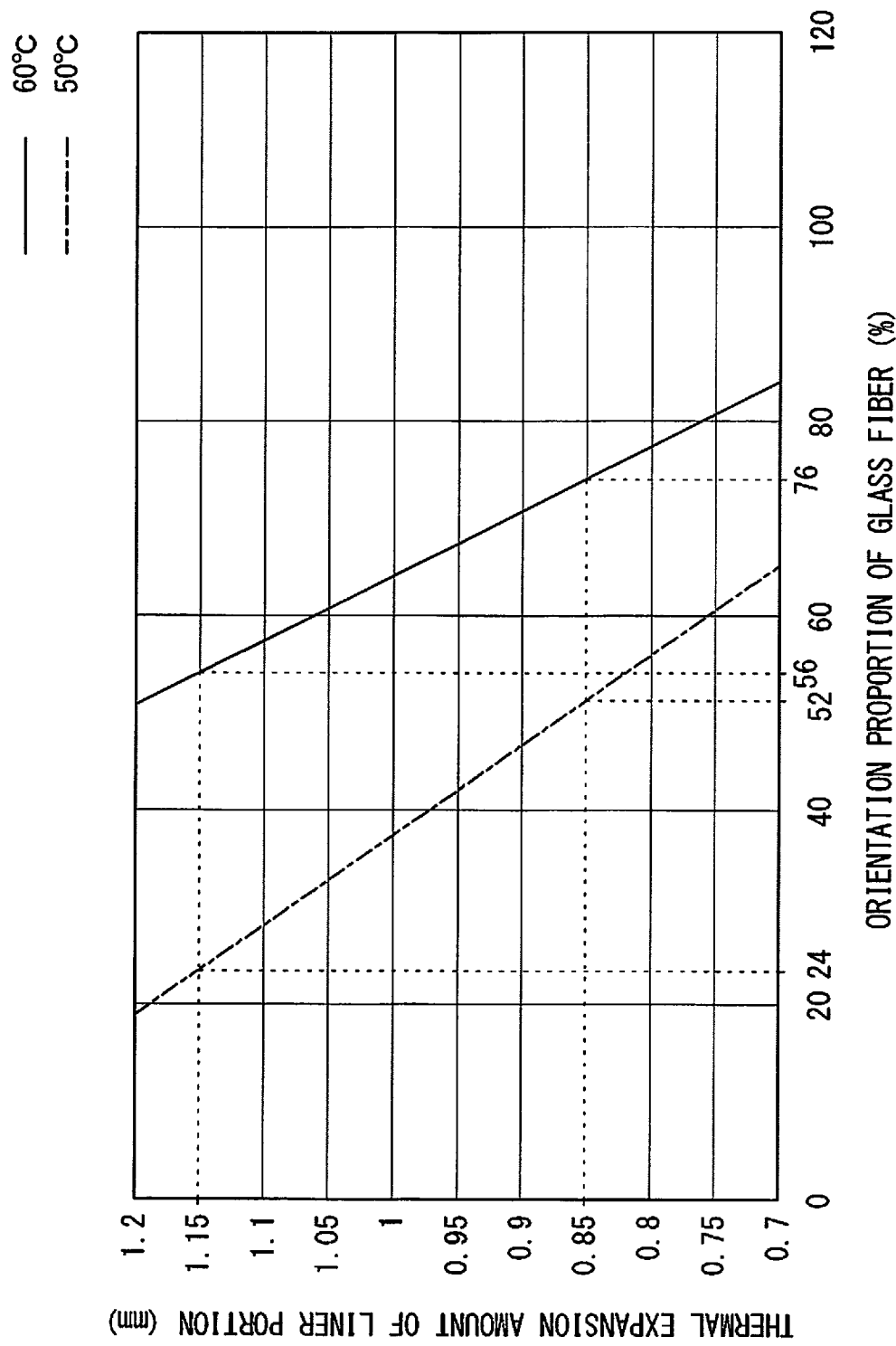
FIG. 10 is a graph showing the relationship between the orientation proportion of glass fibers contained in a resin material of a liner portion and the thermal expansion amount of the liner portion.

FIG. 10 is a graph showing the relationship between the orientation proportion of the glass fibers contained in the resin material of the liner portion 18 and the thermal expansion amount of the liner portion 18. As shown in FIG. 10, in a case where the operation temperature of the liner portion 18 is 50° C., if the orientation proportion of the glass fibers is adjusted to about 24 to about 52%, the thermal expansion amount of the liner portion 18 can be made 0.85 to 1.15 mm. In a case where the operation temperature of the liner portion 18 is 60° C., if the orientation proportion of the glass fibers is adjusted to about 56 to about 76%, the thermal expansion amount of the liner portion 18 can be made 0.85 to 1.15 mm.

Therefore, at 50 to 60° C. which is the operation temperature of the liner portion 18, in order for the thermal expansion amount of the liner portion 18 to be made 0.85 to 1.15 mm which is the thermal expansion amount of the bottom plate 15, the orientation proportion of the glass fibers may be adjusted to about 24 to about 76%. Accordingly, the difference between the thermal expansion amount of the liner portion 18 and the thermal expansion amount of the bottom plate 15 can be reduced.

<Protection Plate and Shielding Member>

With reference back to FIG. 4, the housing 11 includes: a protection member 30 mounted to the frame body portion 17; and a shielding member 40 which covers the liner portion 18. The protection member 30 includes: a short-side protection plate 31 which covers the entirety of the lower halves of the inner surfaces of the short-side lateral wall portions 17b; and a long-side protection plate 32 which covers the entirety of the lower halves of the inner surfaces of the long-side lateral wall portions 17c. The short-side protection plate 31 and the long-side protection plate 32 are each composed of a plate member formed from metal such as aluminium, for example.

Lower end portions of the short-side protection plate 31 and the long-side protection plate 32 are bent to the inner side (the bottom plate 15 side), and also cover the upper surface of the base portion 17a (see FIG. 5) protruding to the inner side with respect to the short-side lateral wall portions 17b and the long-side lateral wall portions 17c. The short-side protection plate 31 and the long-side protection plate 32 may be formed so as to cover the entirety in the height direction of the inner surfaces of the short-side lateral wall portions 17b and the entirety in the height direction of the inner surfaces of the long-side lateral wall portions 17c.

Through the above configuration, when the light concentrated position by a Fresnel lens 13f (see FIG. 2) of the concentrating portion 13 has deviated from a power generating element 12c adjacent to the frame body portion 17, the concentrated sunlight can be prevented from hitting the base portion 17a of the frame body portion 17, the short-side lateral wall portions 17b, and the long-side lateral wall portions 17c, by the short-side protection plate 31 and the long-side protection plate 32. Thus, the protection member 30 can prevent the frame body portion 17 from being damaged by heat due to sunlight. In addition, since the protection member 30 formed from metal has good reflectance of sunlight and small absorptivity of sunlight, thermal damage of the frame body portion 17 can be assuredly prevented.

Figure 11:
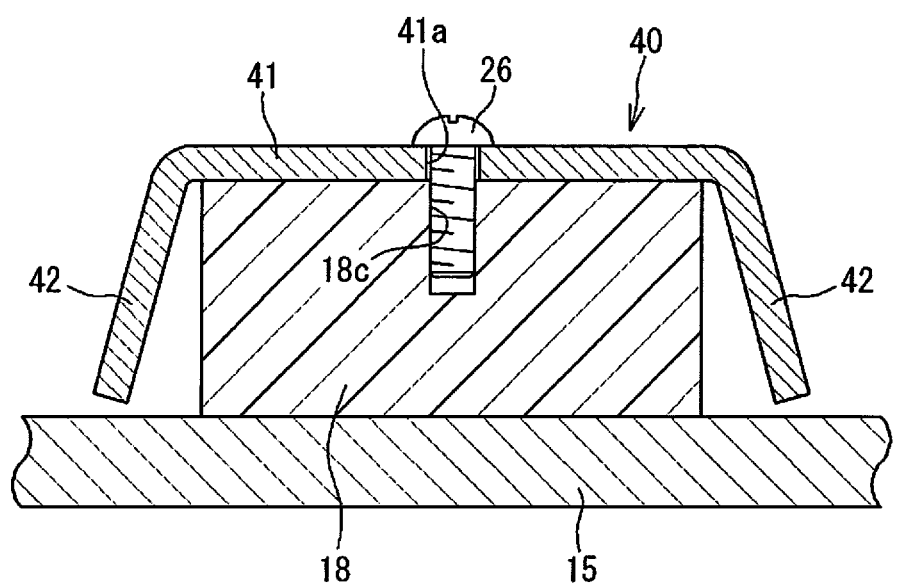
FIG. 11 is a cross-sectional view showing a shielding member.

FIG. 11 is a cross-sectional view showing the shielding member 40. In FIG. 11, the shielding member 40 is composed of a plate member formed from metal such as aluminium, for example. In the shielding member 40, a flat plate portion 41 which covers the entirety of the upper surface of the liner portion 18; and a pair of bent portions 42 which extend so as to be bent to the bottom plate 15 side from both end portions in the width direction (left-right direction in FIG. 11) of the flat plate portion 41 and which cover both side surfaces of the liner portion 18, are integrally formed.

At the upper surface of the liner portion 18, screw holes 18C are formed (also see FIG. 5) at both sides in the longitudinal direction of the liner portion 18. A small male screw 26 inserted in an insertion hole 41a penetrating in the plate thickness direction of the flat plate portion 41 in the shielding member 40 is screwed in each screw hole 18C. Accordingly, the shielding member 40 is fixed to the liner portion 18. Although the small male screws 26 are used in the present embodiment, bolts may be used.

According to the above configuration, when the light concentrated position by a Fresnel lens 13f (see FIG. 2) of the concentrating portion 13 has deviated from a power generating element 12c adjacent to the shielding member 40, the concentrated sunlight can be prevented from hitting the liner portion 18, by the flat plate portion 41 and the bent portions 42 of the shielding member 40. Thus, the shielding member 40 can prevent the liner portion 18 from being damaged by heat due to sunlight. In addition, since the shielding member 40 formed from metal has good reflectance of sunlight and small absorptivity of sunlight, thermal damage of the liner portion 18 can be assuredly prevented.

If a plurality of the concentrator photovoltaic modules 1M as described above are arranged to form a concentrator photovoltaic panel 1, the concentrator photovoltaic panel 1 can obtain desired power generation.

In addition, a concentrator photovoltaic apparatus 100 that includes: the concentrator photovoltaic panel 1 as described above; and the driving device 5 which drives the concentrator photovoltaic panel 1 so as to perform operation of tracking the movement of the sun while facing the direction of the sun, can always maintain, during daytime, the state where the power generation efficiency is highest at that point in time.

<Others>

The embodiment disclosed herein is merely illustrative and not restrictive in all aspects. The scope of the present disclosure is defined by the scope of the claims rather than the meaning described above, and is intended to include meaning equivalent to the scope of the claims and all modifications within the scope.

REFERENCE SIGNS LIST 1 concentrator photovoltaic panel
1M concentrator photovoltaic module
1U unit
2 pedestal
3 base
4 support portion
6 shaft
7 beam
8 frame
11 housing
11b flange portion
12 flexible printed circuit
12c power generating element
13 concentrating portion
13f Fresnel lens
15 bottom plate
15a positioning hole
15b insertion hole
16 frame body
17 frame body portion
17a base portion
17b short-side lateral wall portion
17c long-side lateral wall portion
18 liner portion
18A narrowed portion (shape changing portion)
18B un-narrowed portion
18C screw hole
19 positioning pin (positioning portion)
20 protruding portion
21 seal layer
22 inner protruding portion
22a screw hole
23 small male screw (screw)
24 outer protruding portion
25 seal layer
26 small male screw
30 protection member
31 short-side protection plate
32 long-side protection plate
40 shielding member
41 flat plate portion
41a insertion hole
42 bent portion
100 concentrator photovoltaic apparatus
181 straight portion
182 tapered portion
183 adhesion surface
184 adhesion surface
Ax optical axis
R1 region
R2 region
W1 width dimension of narrowed portion
W2 width dimension of un-narrowed portion

The invention claimed is:

1. A concentrator photovoltaic module comprising:
a concentrating portion formed by arranging a plurality of lens elements each configured to concentrate sunlight; and
a housing configured to accommodate a plurality of power generating elements disposed at positions respectively corresponding to the lens elements, wherein
the housing includes:
a frame body formed from resin; and
a bottom plate formed from metal, the bottom plate being mounted to the frame body and having the power generating elements mounted thereto, and
the frame body includes:
a frame body portion forming an outer frame; and
a liner portion extending along an upper surface of the bottom plate at an inner side of the frame body portion, the liner portion having both end portions thereof formed integrally with the frame body portion, wherein
the frame body is formed from a resin material that contains glass fibers,
the liner portion has:
a plurality of narrowed portions being a plurality of shape changing portions formed at a halfway portion in a longitudinal direction of the liner portion; and
a plurality of un-narrowed portions in which the plurality of narrowed portions are not formed, and
each narrowed portion has a smaller width than each un-narrowed portion.

2. The concentrator photovoltaic module according to claim 1, wherein
the housing further includes a shielding member which covers the liner portion.

3. The concentrator photovoltaic module according to claim 2, wherein
the shielding member is made of metal.

4. The concentrator photovoltaic module according to claim 1, wherein
the liner portion has a positioning portion configured to position the bottom plate with respect to the liner portion.

5. The concentrator photovoltaic module according to claim 1, wherein
the housing includes a screw penetrating the bottom plate and configured to fix the bottom plate to the liner portion, and
a seal layer configured to seal an inside of the housing around the screw penetrating the bottom plate is formed between the bottom plate and the liner portion.

6. The concentrator photovoltaic module according to claim 5, wherein
an adhesion surface, of the liner portion, to which the seal layer is adhered, is embossed.

7. A concentrator photovoltaic panel formed by arranging a plurality of the concentrator photovoltaic modules according to claim 1.

8. A concentrator photovoltaic apparatus comprising:
the concentrator photovoltaic panel according to claim 7; and
a driving device configured to drive the concentrator photovoltaic panel so as to perform operation of tracking movement of the sun while facing a direction of the sun.

* * * * *